United States Patent
Kallaher et al.

(10) Patent No.: US 10,629,798 B1
(45) Date of Patent: Apr. 21, 2020

(54) SEMICONDUCTOR FABRICATION

(71) Applicant: Microsoft Technology Licensing, LLC, Redmond, WA (US)

(72) Inventors: Raymond Leonard Kallaher, West Lafayette, IN (US); Geoffrey Charles Gardner, West Lafayette, IN (US); Sergei Vyacheslavovich Gronin, West Lafayette, IN (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/246,289

(22) Filed: Jan. 11, 2019

(51) Int. Cl.
  *H01L 39/00* (2006.01)
  *H01L 39/24* (2006.01)
  *H01L 39/22* (2006.01)
  *H01L 39/02* (2006.01)
  *G06N 10/00* (2019.01)

(52) U.S. Cl.
  CPC ........ *H01L 39/2493* (2013.01); *H01L 39/025* (2013.01); *H01L 39/223* (2013.01); *G06N 10/00* (2019.01)

(58) Field of Classification Search
  None
  See application file for complete search history.

(56) References Cited

U.S. PATENT DOCUMENTS

| 8,563,395 | B2 | 10/2013 | Mi | |
| 2018/0090662 | A1* | 3/2018 | Stevenson | H01L 39/00 |

FOREIGN PATENT DOCUMENTS

DE  102017002616 A1 * 9/2018

OTHER PUBLICATIONS

Fan et al., "Semiconductor Nanowires: From Self-Organization to Patterned Growth," *Small*, vol. 2, No. 6, pp. 700-717 (Jun. 2006).
Goh, "Selective Area Growth and Characterization of Gan Based Nanostructures by Metal Organic Vapor Phase Epitaxy," Ph.D. Thesis, Georgia Institute of Technology, pp. 1-121 (May 2013).
Krizek et al., "Field effect enhancement in buffered quantum nanowire networks," *Physical Review Materials*, vol. 2, Issue 9, pp. 1-15 (Sep. 2018).
Krizek, "Semiconductor Nanowire Networks Grown by Molecular Beam Epitaxy," Ph.D. Thesis, University of Copenhagen, pp. 1-190 (Jul. 2018).

(Continued)

*Primary Examiner* — Evren Seven
(74) *Attorney, Agent, or Firm* — Klarquist Sparkman, LLP (57) ABSTRACT

In-situ patterning of semiconductor structures is performed using one or more "shadow walls" in conjunction with an angled deposition beam. A shadow wall protrudes outwardly from the surface of a substrate to define an adjacent shadow region in which deposition is prevented due to the shadow wall inhibiting the passage of the angled deposition beam. Hence, deposition will not occur on a surface portion of a semiconductor structure within the shadow region. Shadow walls can thus be used to achieve selective patterning of semiconductor structures. The shadow walls themselves are formed of semiconductor. In one implementation, the semiconductor structure and the one or more shadow walls used to selectively pattern it may be formed using selective area growth (SAG).

20 Claims, 8 Drawing Sheets

(56) References Cited

OTHER PUBLICATIONS

Schallenberg, "Shadow Mask assisted Heteroepitaxy of Compound Semiconductor Nanostructures," Ph.D. Thesis, The Julius Maximilian University of Würzburg, pp. 1-135 (Oct. 2004).
Serban, "Self-Assembled and Selective-Area Growth of Group III-Nitride Semiconductor Nanorods by Magnetron Sputter Epitaxy," Ph.D. Thesis, Linkoping University, pp. 1-66 (May 2018).

* cited by examiner

SEMICONDUCTOR FABRICATION

FIELD

This disclosure relates to semiconductor fabrication. By way of example, and without limitation, an example application of the disclosed technology is the fabrication of superconductor-semiconductor nanostructures for use in quantum computers.

BACKGROUND

Quantum computing is a class of computing in which inherently quantum mechanical phenomena, such as quantum state superposition and entanglement, are harnessed to perform certain computations far more quickly than any classical computer could ever be capable of. In a "topological" quantum computer, calculations are performed by manipulating quasiparticles—called "non-abelian anyons"—that occur in certain physical systems. Anyons have unique physical characteristics that distinguish them from both fermions and bosons. Non-abelian anyons also have unique properties with respect to abelian anyons. It is these unique properties that serve as a basis for topological quantum computing, in which information is encoded as a topological property of non-abelian anyons; specifically the braiding of their space-time worldlines. This has certain benefits over other models of quantum computation. One key benefit is stability, as the quantum braiding is unaffected by perturbations on a scale that could cause error-inducing quantum decoherence in other types of quantum computer.

Broadly speaking, to date, two types of physical system have been considered as potential hosts of non-abelian anyons, namely "5/2 fractional quantum Hall" systems in condensed matter physics, and (more recently) semiconductor-superconductor (SM/SC) nanowires. Regarding the latter, a key advance in the field was the realization that non-abelian anyons, in the form of "*Majorana* zero modes" (MZMs) can be formed in semiconductor (SM) nanowires (NWs) coupled to a superconductor (SC).

One of the issues encountered in the context of SM/SC nanowires is the existence of so-called "soft gap" states. The soft gap issue has been documented in publicly-available literature, and suffice it to say that these soft gap states, when present, are a source of decoherence for the MZMs. Analysis and experiments indicate that a source of the soft gap is disorder in the SM/SC interface, and there has been recent work in the field on improving the quality of the SM/SC interface with the aim of providing more stable MZMs.

SUMMARY

Aspects of this disclosure relate generally to in-situ patterning of semiconductor structures using one or more "shadow walls" in conjunction with an angled deposition beam. A shadow wall protrudes outwardly from the surface of a substrate to define an adjacent shadow region in which deposition is prevented due to the shadow wall inhibiting the passage of the angled deposition beam. Hence, deposition will not occur on a surface portion of a semiconductor structure within the shadow region. Shadow walls can thus be used to achieve selective patterning of semiconductor structures and have various benefits over alternative selective patterning technologies such as stencil masks (which are difficult to align to the necessary level of accuracy) and selective etching (which can degrade the quality of the semiconductor structure). The shadow walls themselves are formed of semiconductor, which has various benefits including those set out below. In one implementation, the semiconductor structure and the one or more shadow walls used to selectively pattern it may be formed using selective area growth (SAG).

A first aspect of the present disclosure provides a semiconductor fabrication method. In a masking phase, a mask layer is formed on a substrate. The mask layer leaves at least one wall region and at least one component region of the substrate exposed, the component region being adjacent the wall region in a plane of the substrate. In a selective area growth (SAG) phase, selective area growth of crystalline semiconductor in the exposed regions of the substrate, wherein the wall and component regions have relative dimensions in the plane of the substrate, which cause a shadow wall component, formed of the crystalline semiconductor in the wall region, to grow to a greater height than a device component formed of the crystalline semiconductor in the component region. In a deposition phase, a layer of deposition material is selectively deposited on the device component using a deposition beam, which has a non-zero angle of incidence relative to a normal to the plane of the substrate and an orientation in the plane of the substrate such that the shadow wall component prevents deposition of the deposition material on a surface region of the device component adjacent the shadow wall component.

That is to say, the shadow wall and the device component are both formed from the semiconductor under SAG conditions. As well obviating the need for stencil masks or etching at a stage that could damage the semiconductor device component, forming the shadow walls from semiconductor using SAG has additional benefits. For example, an alternative would be to form the shadow walls from the mask dielectric. However, semiconductor shadow walls have been found to be less prone to loss of selectivity in the deposition phase than dielectric shadow walls. The loss of selectivity exhibited by dielectric shadow walls can significantly decrease the quality of the partial layer of deposition material formed in the deposition phase. Moreover, in contrast to semiconductor shadow walls, large dielectric shadow walls can also inhibit the growth of semiconductor in the SAG phase.

A second aspect of the present disclosure provides a method of selectively patterning a semiconductor nanostructure with deposition material, the method comprising: using a deposition beam to selectively deposit a layer of deposition material on the semiconductor nanostructure, the semiconductor nanostructure being located, on a surface of a substrate, adjacent a semiconductor shadow wall on the substrate's surface; wherein the semiconductor nanostructure and the adjacent semiconductor shadow wall are disconnected and separated by a non-zero distance in the plane of the substrate, and wherein the substrate's surface lies substantially parallel to a plane of the substrate, and the deposition beam has a non-zero angle of incidence relative to a normal to the plane of the substrate and an orientation in the plane of the substrate such that the shadow wall component prevents deposition on a surface portion of the semiconductor nanostructure within a shadow region defined by the semiconductor shadow wall.

By way of example, the semiconductor structure and the layer of deposition material selectively deposited thereon may be incorporated into a computer device (such as a quantum computer), the semiconductor nanostructure and the layer of deposition material deposited thereon constituting a computing component of the computer device which is controllable to perform computational operations. In that event, the semiconductor wall component may not be incorporated in the computer device or may be incorporated as a dummy component which does not perform any computational operations. For example, the computing component may embody a set of qubits, which is controllable to perform quantum computations

BRIEF DESCRIPTION OF FIGURES

For a better understanding of the present technology, and to show how embodiments of the same may be carried into effect, reference is made by way of example only to the following figures in which.

DETAILED EMBODIMENTS OF THE DISCLOSED TECHNOLOGY

Embodiments of the present technology are described below. In the described embodiments, the technology is applied to the fabrication of SM-SC nanostructures. It is, however, noted that the technology has other useful applications, and can, in general, be applied with any SAG semiconductor structures to be selectively patterned with a layer of deposition material.

Epitaxial semiconductor superconductor materials are a promising platform for gatable low-dissipation superconducting electronics and superconducting quantum computation. In the context of topological quantum computing, superconducting nanowires (NWs) with strong spin-orbit coupling can support topological excitations that can serve as the basis for fault tolerant quantum information processing.

Current approaches to synthesize semiconductor-superconductor materials for gatable superconducting nanowire electronics are either based on two-dimensional planar materials (see, e.g., Shabani et al. PRB 93, 155402 (2016)) or bottom up grown nanowire materials (see, e.g., Krogstrup et al. Nature Mater. 14, 400-406 (2015)). Both approaches are facing challenges with scalability for different reasons. Regarding the latter approach, this has been able to achieve a very high-quality SM/SC interface. However, with this approach, the SM/SC nanowires to form part of a network have to be individually grown and, once grown, individually placed on an insulating material to form the actual network. Thus, scaling up this approach to larger networks presents very significant challenges.

By contrast, in the described embodiments of the present technology, a desired SM heterostructure, such as network of SM nanowires, is grown in-situ on a substrate using selective area growth (SAG). In SAG, an amorphous mask layer—typically a dielectric oxide (SiOx, AlOx etc.)—is formed on the substrate, which leaves one or more regions of the substrate exposed (e.g. based on lithography and selective etching). SM material is then selectively grown within the one or more exposed regions only, by inducing appropriate growth conditions.

A SC layer is then epitaxially formed on the desired SM heterostructure in a subsequent deposition phase.

To build a functional device, it may be necessary to only selectively pattern the desired SM heterostructure with SC. One way to achieve this would be to epitaxially grow SC on the SM heterostructure in-situ such that the SC is deposited over the entire surface of the semiconductor and then selectively remove (etch) the SC layer from the SM surface in certain regions to achieve the desired SC patterning. However, the techniques (e.g. chemical etching, ion sputtering, reactive ion etching, anodic oxidation) that are often used to selectively remove SC can damage the underlying SM layer leading to sub-optimal qualities in the SM and overall device. Depending on the device, the induced degradation in the SM layer may have a severe effect on device characteristics. In addition, so called "metal lift-off processing" is not viable for SC-SM devices which require the SC layers to be grown epitaxially on the SM surface.

Instead, in the examples of fabrication technology described herein, purpose-built components are used to cast "shadows" that cause patterned nanoscale structures to be formed during a directional deposition of material on a substrate. The terms "shadow wall", "shadow mask", "smart wall" or simply "wall" may be used interchangeably herein to refer to such components, which protrude outwardly of the substrate. This allows predefined regions of the substrate to be excluded from the deposition of the material, thereby creating nanoscale patterns. Such regions may be referred to as "shadow regions", these being regions in which deposition is prevented because the shadow walls inhibit the passage of the deposition material into those regions. These regions are exposed regions of the surface of the substrate adjacent the shadow walls (i.e. they are next to the shadow walls on the surface of the substrate, not underneath them). The deposition beam is performed using an angled beam, and because the shadow walls protrude outwardly from the surface of the substrate, they selectively prevent deposition in exposed shadow regions adjacent the opposite sides of the shadow walls to which the beam is incident.

One option would be to form the shadow walls as sufficiently large features on the SAG mask using the same mask dielectric. The disadvantage of this technique is that dielectric walls are prone to loss of selectivity at the time of SM growth. This causes a significant quantity of parasitic polycrystals to be formed on them, which in turn can cause significant decay of SC film quality during subsequent deposition.

Large dielectric shadow walls can also inhibit the growth of SM in nearby regions when SAG is used.

By contrast, in the described embodiments, on-wafer shadow walls are formed from SM during selective area growth (SAG) of a semiconductor layer. That is to say, the shadow walls are themselves are crystalline semiconductor components formed at the same time and in the same way (i.e. via SAG) as the semiconductor device components (e.g. as nanowires) to be patterned.

For the present purposes a "wafer" will be taken herein to refer to the base layer, and a "substrate" will refer to the wafer plus any other layers already deposited over the wafer at the current stage in the fabrication process, including smart walls, masks, deposited material etc. It is noted however that references to layers, components, structures etc. on a wafer does not necessarily mean those layers/components/structures etc. have to be in direct contact with the surface of the wafer (so in a multi-layered substrate, all of those layers are said to be on the wafer).

It has been observed that a SAG semiconductor system under typical SAG conditions is "self-limiting", in that the height to which a SAG semiconductor component will grow is dependent on its dimensions in the plane of the substrate, and in particular its width. This is exploited to grow the shadow walls to a greater height that the device components to be patterned in the SAG phase, and thereby achieve a desired patterning effect in the subsequent deposition phase.

It has been demonstrated that, under typical conditions of SAG, growth in thin area openings stops after nanowires reached pyramid shape while on wider openings it continues. This effect allows wide square mask openings to be intentionally grown in the vicinity of SAG nanowires, in order to form SM walls suitable for shadowing angled SC deposition.

This is described in further detail below. First, some useful context to the described embodiments is provided.

Figure 1:
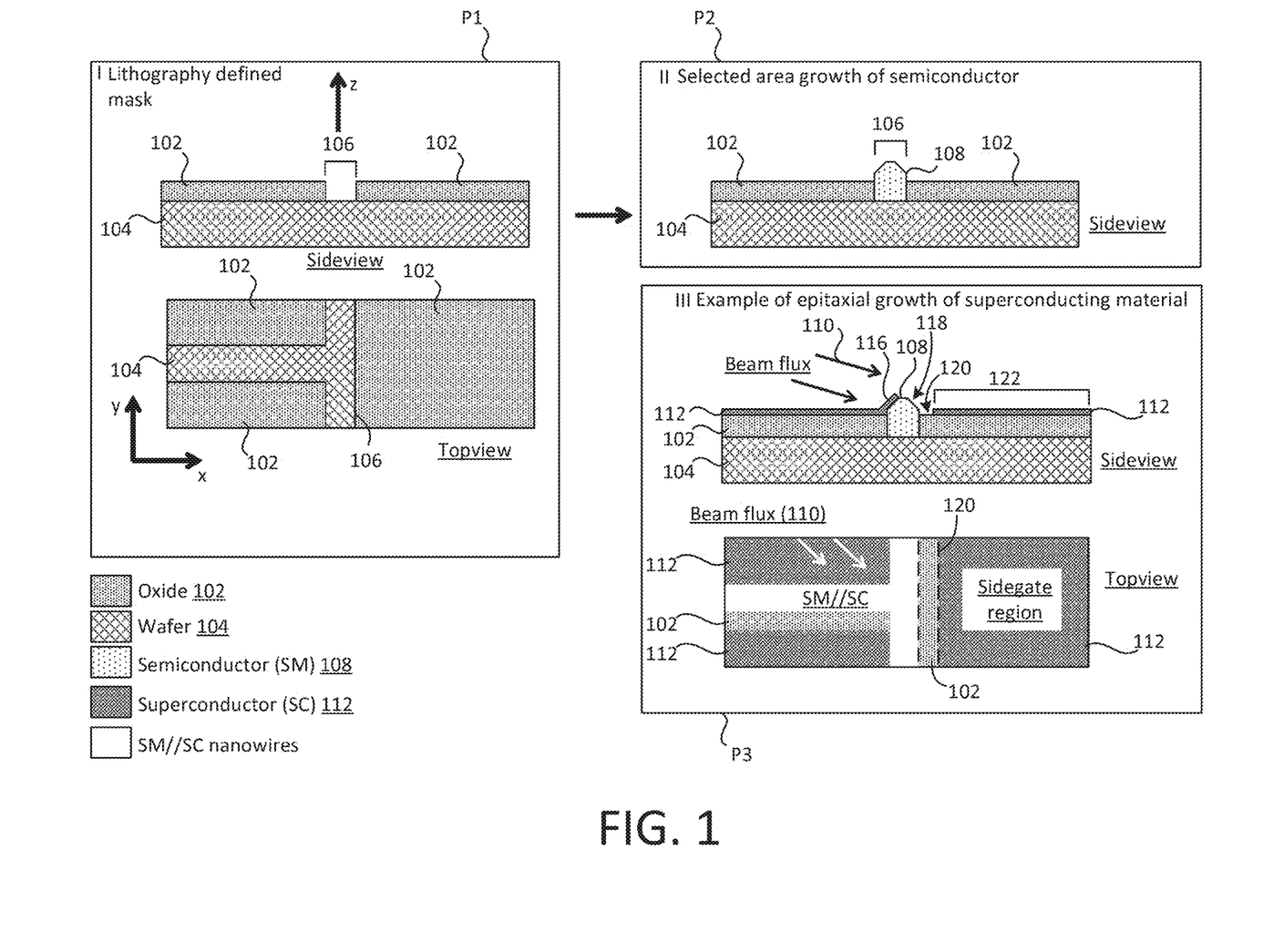
FIG. 1 shows a schematic illustration of a method of fabricating a network of SM/SC nanowires.

Context:

With reference to FIG. 1, an example three-phase fabrication method will now be described. The fabrication method can be used to create a network of SM/SC nanowires, which in turn can for example form the basis of a quantum circuit (e.g. for a quantum computer) or other mixed semiconductor-superconductor platform. In particular, the method is particularly suitable for fabricating a SM/SC nanowire network capable of hosting stable MZMs, with no or significantly reduced soft gap decoherence, which can form the basis of fault-free topological quantum computations.

It is noted, however, that although the material platform is relevant for quantum computing, the gatable superconducting electronics it provides may well have other applications outside of or which are not directly related to quantum computing, particularly in contexts where low energy dissipation is required.

As will become apparent, because the SM/SC nanowire network is created using SAG, an entire nanowire network can be fabricated as a whole substrate. The insulating mask layer and the nanowire can incorporated directly into the final product, without any need to transfer the nanowires to a different surface. Thus, the method is significantly more scalable than the existing approaches.

1) Masking Phase

In a first phase P1 (masking phase) a patterned layer of dielectric material 102 (dielectric mask) is formed on top of a wafer 104. A side-view and a top-view of the wafer 104 with the dielectric mask 102 are shown on the left hand side of FIG. 1. The wafer 104 can be formed of any suitable substrate material such as InP (Indium Phosphide), GaAs (gallium arsenide), and is an insulating substrate in the described examples (but may or may not be insulating in general depending on the application). In the described examples, the dielectric material 102 is an oxide but it can be any dielectric material that facilitates SAG in a second phase P2 of the fabrication method (see below).

The oxide layer is patterned in that the oxide layer 102 is formed so as to leave narrow strips of the substrate—in a desired region 106—exposed (i.e. not covered by the oxide 102). The pattern in this context refers to the structure of the desired region 106, which will ultimately become the structure of the nanowire network, as it is this exposed region 106 in which SM nanowires are grown. Accordingly, the size and structure of the nanowires matches the size and structure of the exposed region 106. Although only one exposed region 106 is shown in FIG. 1, nanowires can be grown simultaneously in multiple regions and all description pertaining to the desired region 106 applies equally to multiple such regions. Accordingly, the structure of an entire nanowire network can be defined by the structure of the exposed region(s). In this example, the strips and hence the resulting nanowires have a width of the order of tens or hundreds of nanometers.

The oxide layer 102 can be formed so as to leave the desired region 106 exposed in any suitable manner. For example, a uniform, continuous layer of oxide can be deposited on the wafer 104, and the exposed region 106 can then be formed by selectively etching away the oxide 102 from the desired region 106 (in this case, it is the etching that defines the eventual nanowire network structure). As another example, the oxide layer 102 can be selectively deposited on the wafer 104 with a mask used to prevent deposition of the oxide 102 in the desired regions 106 (in this case, it is the mask that defined the eventual nanowire network structure).

The SAG nanowires are defined along high symmetry in-plane crystal orientations on the substrate, which also gives well-defined faceting of the nanowires. This makes the SC/SM interface flat, potentially atomically flat, and well defined.

2) SAG Phase

In the second phase P2, namely the SAG phase, a semiconductor material 108 is selectively grown within the desired regions 106, on top of the exposed portion of the wafer 104. An example is illustrated at the top right of FIG. 1, at which a side-view of the wafer 104 is shown. Due to the patterning of the oxide layer 102, the selectively grown semiconductor 108 forms in-plane nanowires (that is, nanowires lying in the place of the wafer 104).

SAG is a growth method using crystal growth vacuum chambers. SAG refers to localized growth of crystalline semiconductor (i.e. semiconductor having a crystal structure) in exposed regions of the substrate, with growth conditions selected to prevent such growth on the dielectric mask itself. This can be based on Chemical Beam Epitaxy (CBE), Molecular Beam Epitaxy (MBE), or Metal-Organic Chemical Vapour Deposition (MOCVD), for example. In the context of semiconductors, SAG refers to a particular class of epitaxial semiconductor growth (and is also referred to as selective area epitaxy), in which a patterned dielectric mask is used to define the intended structure of the semiconductor material to be grown (a form of lithography). The SAG process is tuned such that semiconductor growth occurs only on regions of the substrate that are not covered by the dielectric mask, and not on the dielectric mask itself. This is quite different from other deposition/growth processes, such as bottom up growth (in which no mask is used) and uniform deposition (epitaxial or otherwise) in which material is uniformly deposited across a surface irrespective its material composition (as in phase P3—see below). SAG is conducted in a high or ultra-high vacuum, and requires careful tuning to achieve the desired selective semiconductor growth.

Any suitable SAG process can be used in the second phase P2 to create the desired SM nanowires in the exposed region 106.

SAG per-SM is known, and is therefore not discussed in further detail herein. For further description of SAG, see, e.g., G. J Davies Proc. SPIE 2140, Epitaxial Growth Processes, 58 (May 11, 1994); doi:10.1117/12.175795; M Fahed, Doctoral thesis: Selective area growth of in-plane III-V nanostructures using molecular beam epitaxy, 2016. http://www.theses.fr/2016LIL10114; Fukui et al, Appl. Phys. Lett. 58, 2018 (1991); doi: http://dx.doi.org/10.1063/10.105026.

Suffice it to say that the SAG phase P2 is such that, at the end of that phase, the semiconductor material 108 fills the desired region 106 (that is, the region 106 in which the wafer 104 is not covered by the oxide mask 102) but does not extend, in the plane of the wafer 104 (xy plane hereafter), beyond the boundaries of the desired region 106 as defined the oxide layer 102. However, as can be seen, it does extend outwardly in a direction normal (perpendicular) to the plane of the wafer 104 (z-direction hereafter) so as to protrude outwardly of the oxide mask 102. That is, the semiconductor material 108 extends a greater distance from the wafer 104 than the oxide layer 102 in the z-direction. In this manner, the semiconductor material 108 forms nanowires lying substantially in the plane of the substrate 102 (in-place nanowires).

The semiconductor material 108 can be any suitable semiconductor material, such as Indium arsenide (InAs). The SAG semiconductor 108 can for example be confined 2DEG (two-dimensional electron gas) semiconductor or single material semiconductor.

3) Superconductor Growth Phase

In a third phase P3 a layer of superconducting material 112 is grown using a particle beam 110. Herein, a superconducting material means a material that exhibits superconducting properties at least under certain conditions. An example of such a material is aluminum (Al). In the following examples, the superconductor is grown epitaxially in phase P3, and the superconductor growth phase P3 may be referred to as an epitaxial growth phase in this context. However, the technology is not limited in this respect, and it may be possible to achieve the intended result via non-epitaxial superconductor growth in phase P3. It will thus be appreciated that, although following description refers to epitaxial superconductor growth by way of example, the relevant description applied equally to non-epitaxial semiconductor growth.

Phase P3 is generally referred to herein as the deposition phase, but may equivalently be referred to as the epitaxial growth phase or semiconductor growth phase in the following description.

The superconducting material 112 can be grown in phase P3 using molecular beam epitaxy (MBE) or electron gun epitaxy, for example.

At least part of the superconductor layer 112 is deposited on top of the SM nanowire 108 such that this part of the superconductor layer 112 (labelled 116 in FIG. 1) is in direct contact with the SM nanowire 108. That is, such that the SM nanowire 108 is at least partially covered with superconducting material.

This is also a form of epitaxy, but it is not SAG. In particular, in the epitaxial growth phase P3, epitaxial growth does occur on the oxide layer 102, as well as on the SM nanowires 108.

As shown, the particle beam 110 is incident on the wafer 104 with a non-zero angle of incidence relative to the z-direction (deposition angle). As a consequence of this non-zero deposition angle and the protruding structure of the SM nanowire 108, the SM nanowire 108 is only partially coated by the superconductor layer 112; that is, a part of the SM nanowire (labelled 118) is not coated by the superconductor material. The bulk of the oxide layer 102 is also coated by the superconductor layer 112, however due to the angle of the incoming beam 110 and the protruding structure of the SM nanowires 108, small regions of the oxide layer 102 immediately adjacent the protruding SM nanowires 108 are left exposed, i.e. not coated by the SC material. One such region is labelled 120 in FIG. 1. Such regions may be referred to as "shadow gaps" herein. The shadow gap 120 separates the SM material 108 from a portion of the SC layer 112 in a "sidegate" region 122. The portion of the SC layer 112 in the sidegate region 122 can be used to form a gate for controlling the SM nanowires 108, or (more likely) the SC material can be etched away from this region and replaced with a more suitable gate material. Either way, the shadow gap 120 ensures the gate operates as intended. Forming the shadow gap 120 using such "in-situ" patterning in the SC epitaxy phase P3 (as described above) ensures that material does not need to be etched away too close to the delicate nanowires 108.

The bottom right of FIG. 1 shows both a side-view and a top-view of the wafer 104 at the end of the third phase P3. Note that, in the top-view, the part 116 of the superconductor layer 112 that partially coats the SM nanowire 108 is not distinguished from the uncoated part 118 of SM nanowires 108; rather the combined nanowire structure formed of the nanowires 108 and the portion of the superconductor material 116 that (partially) covers those nanowires (i.e. that is in direct contact therewith) is depicted as a single element, labelled SM//SC. This combined structure is similarly represented and labelled in later figures, and herein references to "SM/SC nanowires" or "SM//SC nanowires" refer to the SM nanowires 108 and the SC material 116 that (partially) covers the SM nanowires 108, unless otherwise indicated.

Figure 2:
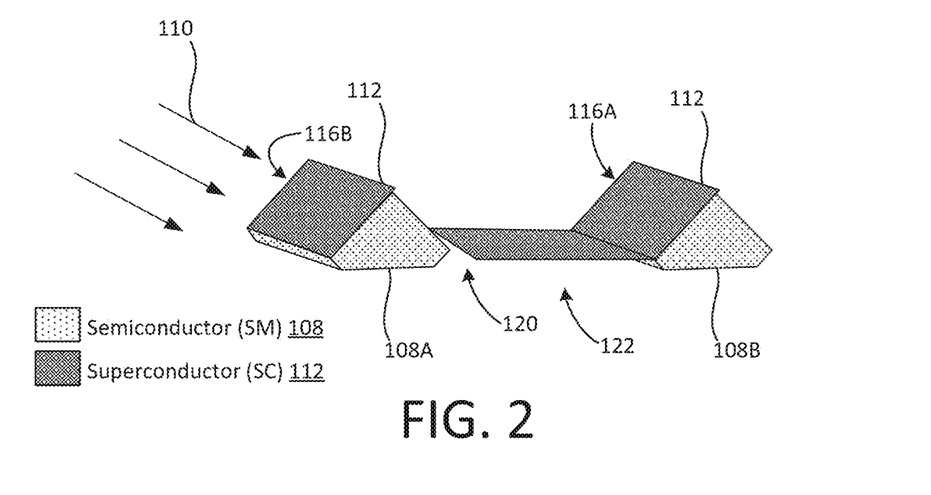
FIG. 2 shows a schematic perspective view of SAG SM nanowires in an epitaxial growth phase, in which superconducting material is deposited on and around the nanowires.

To further aid illustration, FIG. 2 shows a schematic perspective view of first and second nanowires 108A, 108B during the third phase P3, which are partially coated by respective parts 116A, 116B of the superconductor layer 112. A shadow gap 120 of the kind described above is shown, which is immediately adjacent the first nanowire 108A and separates the first nanowire 108A from a portion of the semiconductor layer 112 in a sidegate region 122, in the manner described above.

The SAG phase P2 and superconductor growth phase P3 can be conducted in a vacuum chamber, preferably without moving the wafer 104 between phases. These phases can be carried out under high vacuum or ultra-high vacuum conditions ($\sim 10^{-8}$-$10^{-12}$ Torr or less), and those vacuum conditions may be maintained between phases. Among other things, this ensures a clean SM/SC interface, free from unwanted impurities.

As will be appreciated, both the SAG semiconductor growth of phase P2 and the superconductor growth of phase P3 require carefully calibrated conditions to get within respective "growth windows" for these two phases, and thereby achieve the desired semiconductor and superconductor growth respectively. Depending on the material type, the growth conditions, temperature and flux needs to be chosen carefully. For example, for MBE (which can be used in both the semiconductor SAG phase P2 and superconductor growth phase P3), the substrate generally needs to be heated to temperatures of around 500° C. or more to clean the surface for native oxide. However, in the SM SAG phase P2 and SC growth phase P3, the respective temperature windows in which the desired growth takes place is dependent on the composition of the SM material 108 and SC material 112 respectively. The superconductor is grown/deposited in-situ, without breaking vacuum. In this way the surface of SAG is not oxidized in air and remain clean until the SC is put on, which ensure a clean SM-SC interface.

The wafer 104 and oxide layer 102 on which the SM//SC nanowire network is grown can be incorporated in the end-product, such as a quantum circuit or quantum computer, along with the SM/SC nanowire network, without transferring the nanowires from the substrate on which they were originally fabricated.

Embodiments of the disclosed technology include topologically protected quantum computing circuits that comprise networks of nanowires formed using such mixed semiconductor and superconductor regions.

Figure 3:
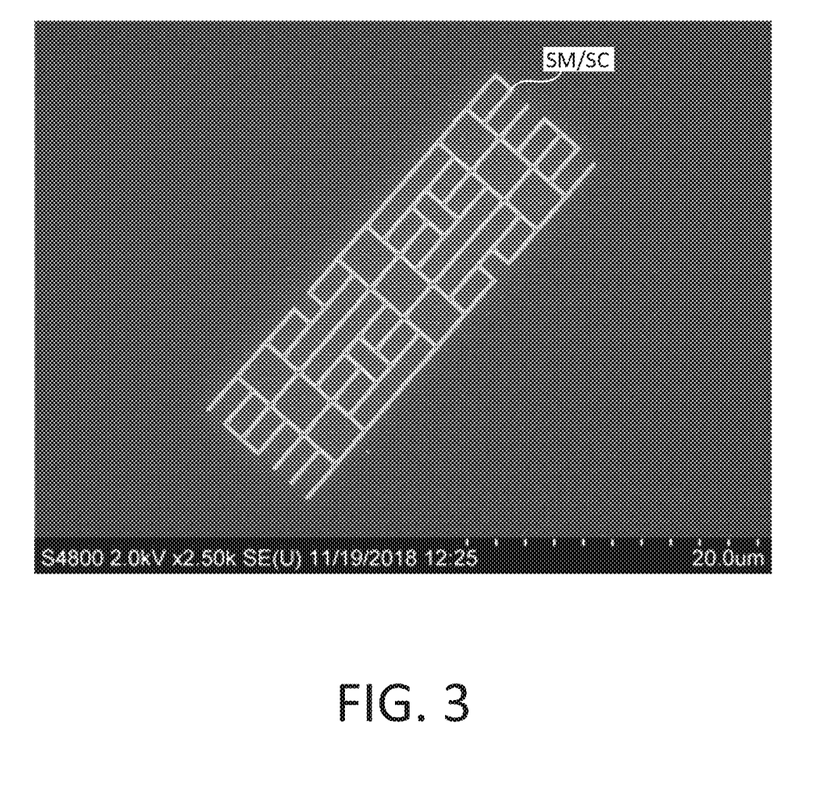
FIG. 3 shows a top view image of a SAG InAs nanowire network on an GaAs substrate.

To aid illustration, FIG. 3 shows an image of an SAG InAS nanowire network grown on a GaAs substrate.

In-Situ Patterning Using SAG SM Shadow Walls

Embodiments of the present technology will now be described.

Figure 4:
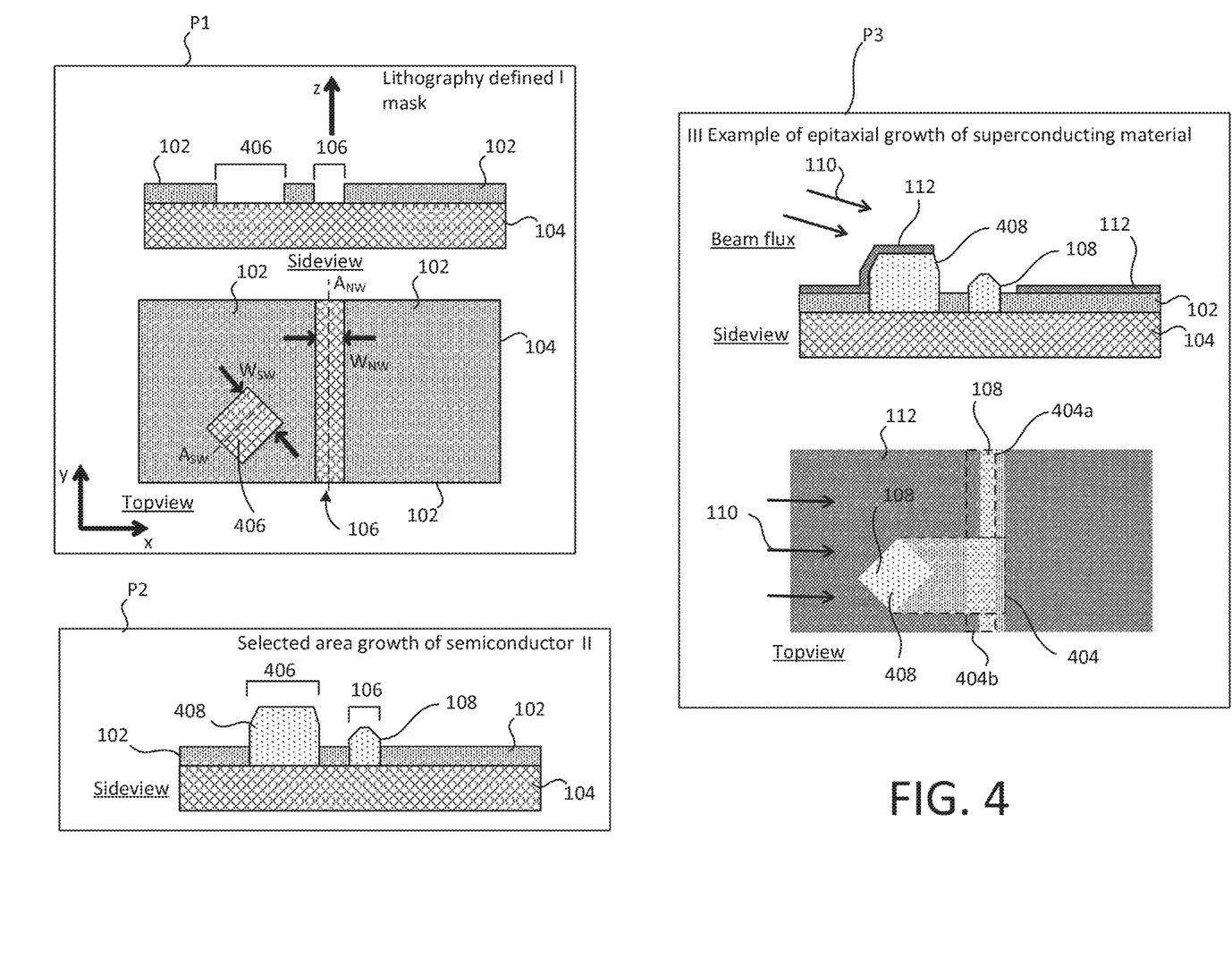
FIG. 4 schematically illustrates an extension of the fabrication method, in which in-situ patterning is used to create additional structure.
Figure 5:
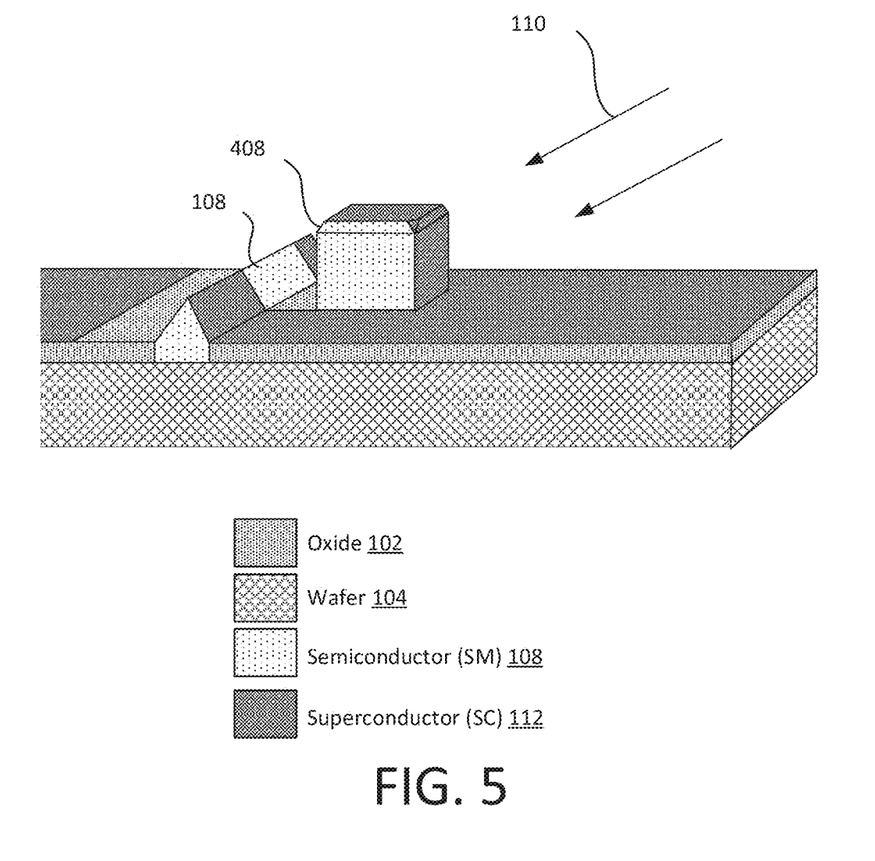
FIG. 5 shows a schematic perspective view to illustrate an example of in-situ patterning used to create a junction.

FIGS. 4 and 5 schematically illustrate an extension of the method of FIG. 1, in which a SAG SM shadow wall 408 is used, in conjunction with an angled beam 110 in the superconductor growth phase P3, to perform in-situ selective patterning of a SAG SM nanostructure such as a nanowire 108. The shadow wall 408 acts to prevent deposition onto a selected surface region of the nanowire 108.

In the masking phase P1, in addition to the exposed region 106 in which the nanowire 108 is to be formed, the mask layer 102 leaves a wall region 406, adjacent the nanowire region 106, exposed. The wall region 406 and the nanowire region 106 have respective widths denoted by $W_{SW}$ and $W_{NW}$ respectively, with $W_{SW} > W_{NW}$.

The term "width" in this context refers to the minimum dimension of the region in the xy plane. The exposed regions 106, 406 are shown to lie substantially along respective axes $A_{NW}$ (nanowire axis) and $A_{SW}$ (shadow wall axis)—denoted by dashed lines—in the xy plane, and the width of each region $W_{SW}$, $W_{NW}$ is the extent of that region in the xy plane perpendicular to its axis $A_{SW}$, $A_{NW}$.

In the SAG phase P2, crystalline semiconductor is grown in the exposed regions 106, 406 to form the nanowire 108 and the shadow wall 408 in the wall and nanowire regions 106, 406 respectively. The nanowire 108 and shadow wall 408 extend along the nanowire axis $A_{NW}$ and the shadow wall axis $A_{SW}$ respectively. The greater width of the wall region 408 causes the semiconductor in that region to grow to a greater height (extent in the z-direction) than that grown in the nanowire region 106, hence the shadow wall 408 has a greater height than the adjacent nanowire 108. This is a consequence of the crystal structure of the semiconductor, as described in further detail below. In FIG. 4, the wall region 408 and the nanowire region 106 are adjacent but non-contiguous. Hence, the nanowire 108 is located adjacent the shadow wall 408, but disconnected from it and separated from it by a distance which is non-zero (i.e. the nanowire 108 and the shadow wall 408 are not in contact with each other) but which is sufficiently small for a surface portion of the nanowire 108 to fall within a shadow region 404 defined by shadow wall 408 and the direction of the angled beam 110 in the deposition phase P3.

In the deposition phase P3, the superconductor layer 112 is formed as described above, using an angled beam 110. However, the beam 110 has an orientation in the xy plane such that it is incident on the side(s) of the shadow wall 408 furthest from the nanowire 108. Because of this, and the fact that the beam 110 has a non-zero angle of incidence relative to the z-axis, the shadow wall prevents deposition in the shadow region 404 in which the surface portion of the nanowire 108 referred to above lies. Moreover, the greater height of the shadow wall 408 causes the shadow region 404 to extend across the full width of the nanowire 108. This creates a "junction" i.e. a section of uncoated nanowire (i.e. uncoated across the entirety of its width) between two surface regions of the nanowire 106 at either end of the junction—denoted by reference numerals 404a and 404b in FIG. 4—in which the nanowire 106 is partially coated with semiconductor material 112 (i.e. partially coated across its width). This can be seen in the top-down view for the deposition phase P3 in FIG. 4 and in the perspective view of FIG. 5 which shows the substrate in the deposition phase P3.

Figure 10:
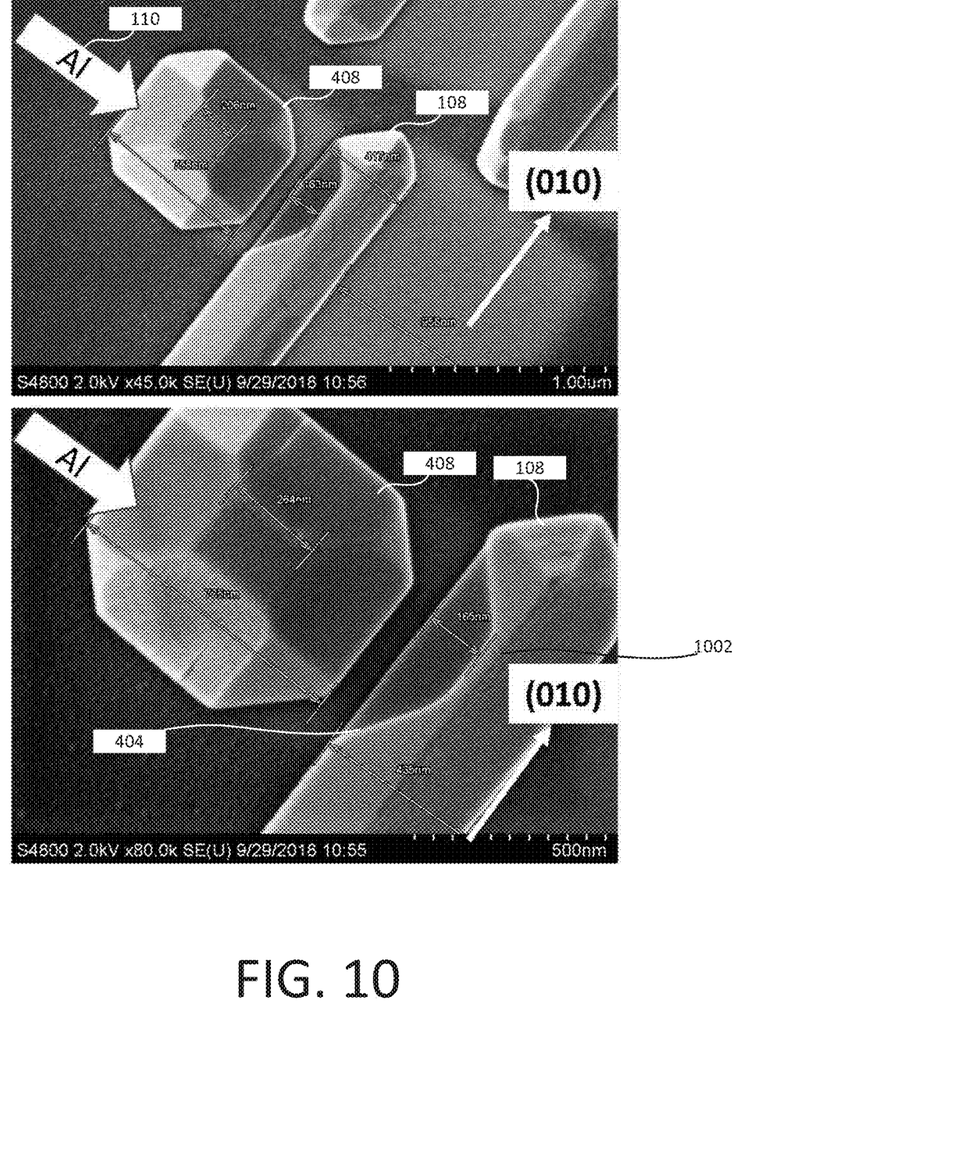
FIG. 10 shows a top-down image of a shadow wall and a nanowire following selective semiconductor deposition.

It is, however, noted that it is not necessary in general for the shadow region 408 to extend across the full width of the nanowire 108 in order to form a junction. As described above, the shape of the nanowire 108 and the angle of the beam 110 mean that even portions of the nanowire's surface outside of the shadow region 404 are only partially coated across their width (as the beam 110 is only incident on one facet of the nanowire 108). Hence, to form a junction region in which the nanowire is only uncoated across its width, it is only necessary for the shadow region 404 to extend across the full width of the surface region on which deposition would otherwise occur (where it not for the presence of the shadow wall 408). By way of example, FIG. 10 shows a top-down image of a SAG shadow wall 408, which defines a shadow region 404 that extends, at least approximately, to the apex of 1002 of a nanowire 108 having a triangular profile in the plane perpendicular to its axis. That is, the shadow region 404 extends across the width of the facet of the nanowire 108 facing the incoming beam 110 but does not extend across the opposite facet and need not do so because no deposition occurs on that facet in any event.

Figure 6:
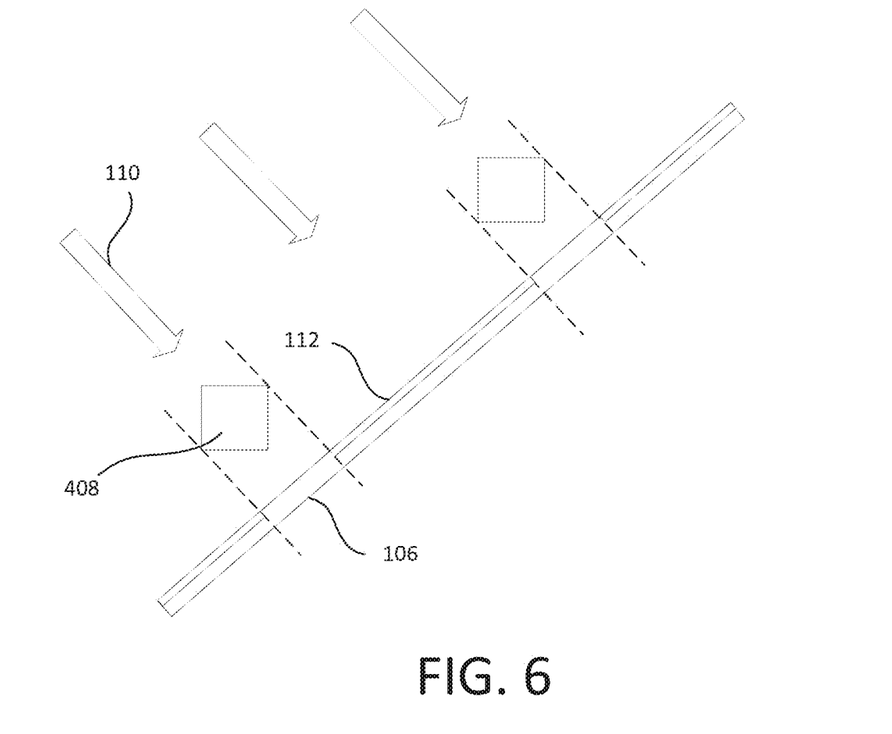
FIG. 6 shows a schematic top-down view of in-situ patterning using multiple shadow walls.

FIG. 6 is a schematic top-down view showing how multiple SAG SM shadow walls 408 may be used to achieve more complex selective patterning of a SAG SM nanowire 106.

Figure 7:
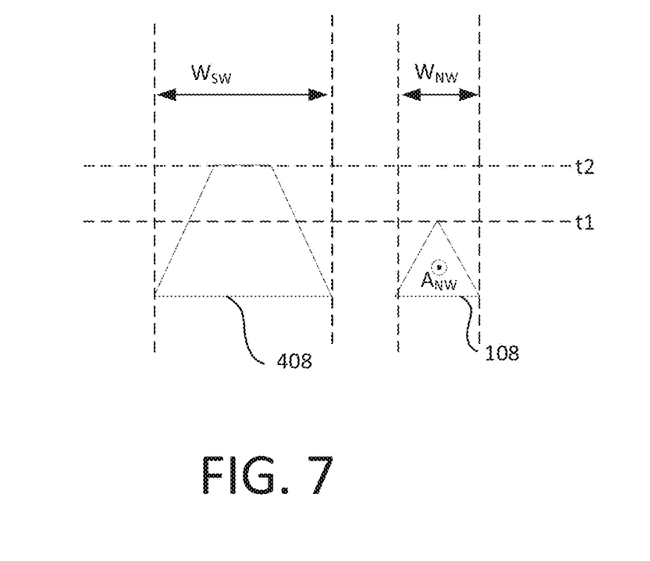
FIG. 7 shows a schematic side view of a shadow wall adjacent a nanowire of maximum height.

Shadow Wall Height:

FIG. 7 is a schematic cross-section view of the nanowire 108 and shadow wall 408, which illustrates the high-level principles that cause the height of the shadow wall 408 to exceed that of the adjacent nanowire 108. FIG. 7 shows a cross-section in a plane perpendicular to the axis $A_{NW}$ of the nanowire. During the SAG phase P2, the shadow wall 408 and the nanowire 108 gradually grow in height. The nanowire 108 has side surfaces that taper inwardly and, during an initial part of the SAG phase P2, the nanowire 108 will have a generally trapezoidal profile as it continues to grow in height. However, eventually the side surfaces of the nanowire 108 will "meet", at time t1, forming a complete triangle. After time t1, even as SAG conditions persist, no significant further growth of the nanowire 108 occurs: the nanowire 108 has now reached its maximum height, denoted by the dashed line labelled t1 in FIG. 7. By contrast, due to its greater width, at time t1, the shadow wall 408 has not reached its maximum height, and can therefore continue to grow after time t1. In the example of FIG. 7, the SAG phase is terminated (i.e. SAG conditions are terminated) at time t2 before the shadow wall 408 has reached the maximum height it could achieve, such that the shadow wall 408 has a substantially flat top surface.

The example image of FIG. 10 demonstrates the effect of such a shadow wall 408 on such a nanowire 108 during the deposition phase P3. In this case, the greater height of the shadow wall 408 causes the shadow region 404 to extend all the way to the apex of the nanowire 108.

Returning to FIG. 7, both the nanowire 108 and the shadow wall 408 are shown to have substantially triangular and trapezoidal profiles respectively in the plane perpendicular to the axis of the nanowire. However, the profiles of the shadow wall 408 and the nanowire 108 can in fact be controlled based on the orientation of their respective axes $A_{SW}$ and $A_{NW}$ relative to the crystal structure of the semiconductor from which they are formed—or, more generally, based on the orientation of their large-scale structure relative to their atomic, crystal structure (noting that "large" in this context is relative and in the present context refers to scales of typically 10s or 100s of nanometers).

This will now be described with reference to FIGS. 8A to 9D.

Figure 8A:
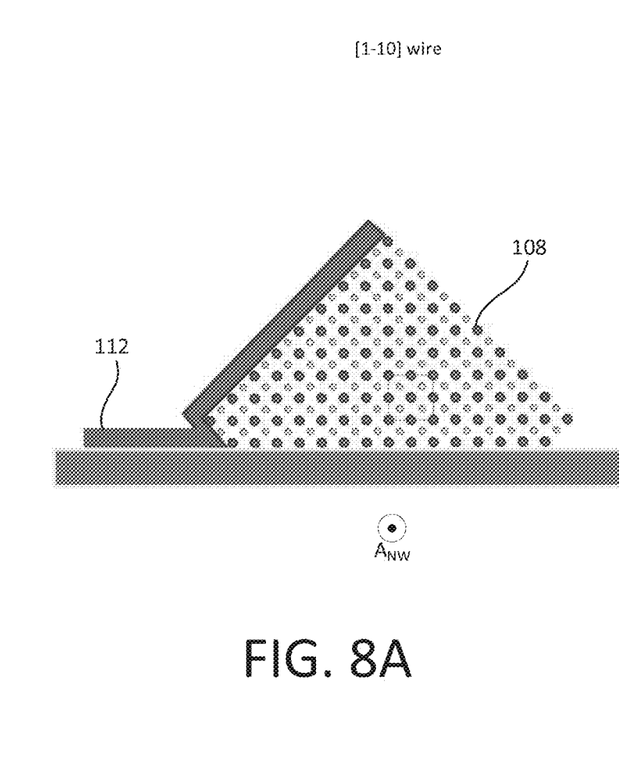
FIGS. 8A and 8B show a cross-section view of nanowires having different orientations relative to their crystal structure.

FIG. 8A shows a schematic cross-section of nanowires having different orientations relative to their crystalline structure. Again, the cross-section is taken in the plane perpendicular to the axis of the nanowire $A_{NW}$.

In FIG. 8A, the nanowire axis $A_{NW}$ (lying perpendicular to the plane of the page) is oriented substantially parallel to a direction having miller index [1-10] as defined by the crystal structure of the SM nanowire 108.

Figure 8B:
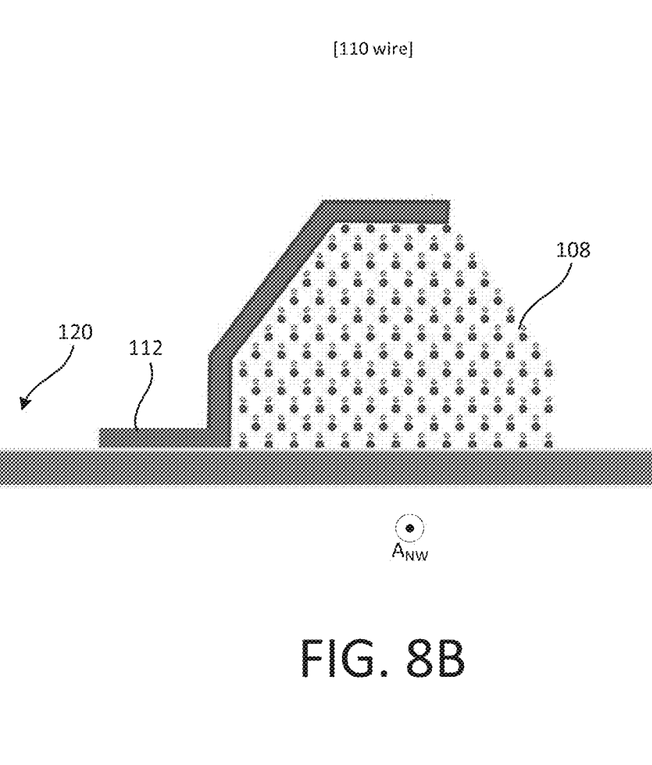

In FIG. 8B, the nanowire axis $A_{NW}$ is oriented substantially parallel to a direction having miller index [110].

Miller indices are an established way for characterizing directions within a crystal structure that are defined by its inherent symmetry.

As will be appreciated, the [1-10] and [110] directions are mutually perpendicular, hence the [1-10] and [100] nanowires of FIGS. 8A and 8B could form part of a network of mutually perpendicular nanowires (perpendicular in the plane of the substrate). Two examples of nanowire networks containing mutually perpendicular nanowires are described herein. In the first example, nanowires within the network are oriented in the [110] and [1-10] directions (as in FIGS. 8A, 8B, and also FIG. 9B described below). In the second example, the nanowires are oriented along the [010] and [100] directions (see FIGS. 9C and 9D and accompanying description below).

As can be seen, an SAG [1-10] wire has an essentially triangular profile when a cross-section is taken across its width, whereas an SAG [110] wire has lower side surfaces that are substantially vertical (albeit with a slight inwardly taper at the top, up to a substantially flat top surface). It will be appreciated that FIGS. 8A and 8B are highly schematic. For example, whilst these Figures show roughly the same angle for the facet of the [100] and [110] wires, in reality the angles for side facets of [100], [010] nanowires are about 45 degrees while for [1-10] nanowires the angle of the facet will be about 54.7 degrees.

This is a physical effect of the orientation of the atomic crystal structure on the large-scale growth of the semiconductor under SAG conditions. FIGS. 9A to 9D illustrate by example how this physical effect can be exploited to optimize the growth of shadow walls and complex nanowire networks.

Figure 9A:
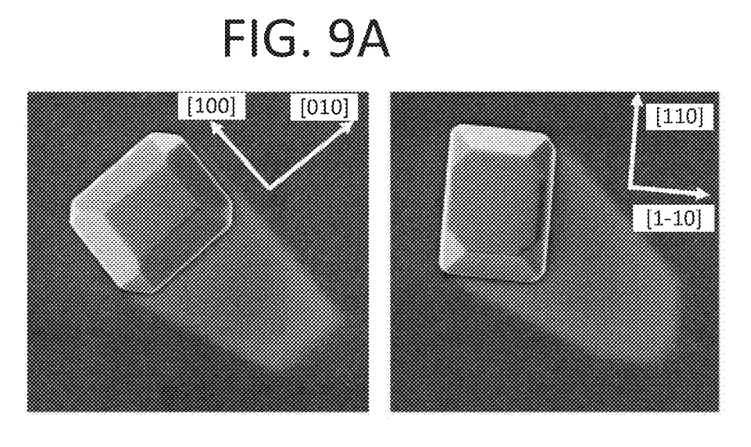
FIG. 9A shows top-down images of semiconductor components having different orientations relative to their crystal structure.
Figure 9B:
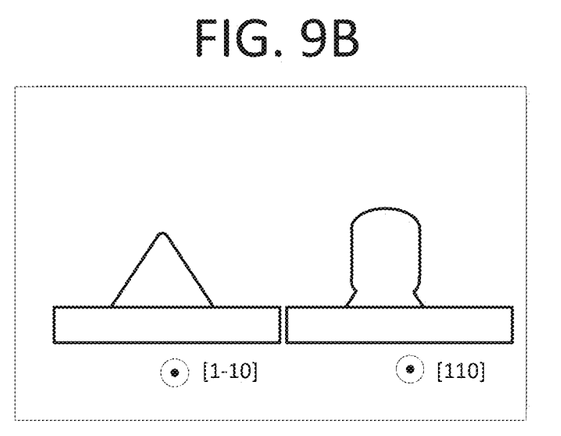
FIG. 9B shows side images of semiconductor components having different orientations relative to their crystal structure.
Figure 9C:
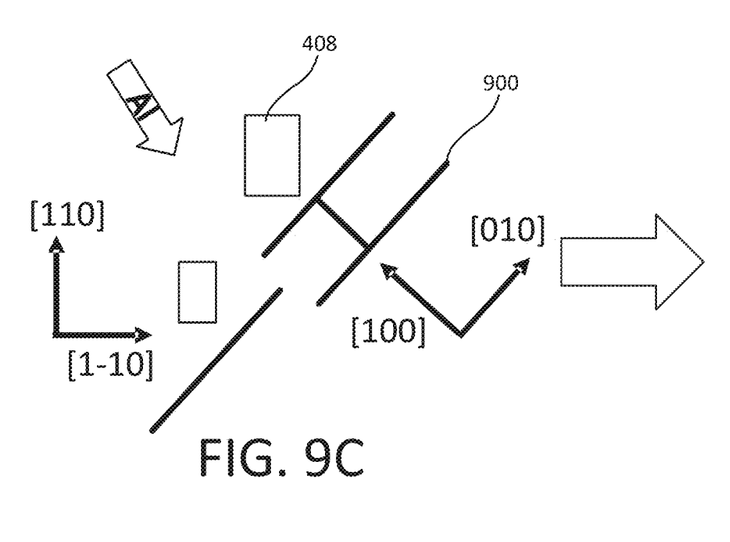
FIG. 9C shows a schematic top-down view of an arrangement in which a network of nanowires is oriented at 45 degrees relative to an adjacent shadow wall.

FIG. 9C shows a schematic top-down view of a network 900 of in-plane nanowires. The network is formed of nanowires, each of which lies in one of two mutually perpendicular directions in the xy plane. These are chosen to be substantially parallel with the directions having Miller indices [100] and [010] respectively.

An adjacent shadow wall is oriented at 45 degrees relative to the network of in-plane nanowires 900, such that is lies substantially along the direction having Miller index [110].

FIG. 9A shows top-down images of SAG SM components grown in different directions relative to their crystal structure. The left-hand image shows a SAG SM component having outer sides (side surfaces) that are aligned in the xy plane with the [100] and [010] directions. As can be seen, all four sides gradually taper inwardly. Therefore, when a cross section is taken perpendicular to either the [100] or the [010] axis, the component would have a trapezoidal profile. The component has a substantially flat top surface because SAG conditions have been terminated before it has reached its maximum height. Had the SAG phase persisted long enough for the component to have reached its maximum height, it would have a triangular profile in both cross-sections. Returning to FIG. 9C, it is therefore evident the nanowires in the network 900 in both the [010] and [100] directions will have triangular profiles, assuming they are grown all the way up to their maximum height.

The right-hand image of FIG. 9A shows a semiconductor component having outer sides in the xy plane that are aligned with the [110] and [1-10] directions respectively. As can be seen, a cross-section of the component in the [1-10] direction would have a substantially trapezoidal profile, because the sides running parallel to the [1-10] direction gradually taper inwardly. Moreover, had the component been grown up to its maximum height, this would become triangular: indeed, this can be seen in the left-hand image of FIG. 9B, which shows a side image of a nanowire whose axis runs in the [1-10] direction and which has been grown to its maximum height.

However, returning to the right-hand image of FIG. 9A, it can be seen that, by contrast, were a cross section to be taken perpendicular to the [110] axis, the profile would be different. This is because the sides running parallel in the [110] direction lack the gradual inward tapering. To illustrate this, the right-hand image in FIG. 9B shows a side image of a semiconductor component whose axis lies parallel to the [110] direction. As can be seen, the sides (side surfaces) running parallel to the [110] direction are substantially vertical at the base of the semiconductor component, before slightly tapering up to a flat top surface.

Returning now to FIG. 9A, it can be seen that the sides of the shadow wall lying parallel to the [110] direction will be substantially vertical (i.e. as in the right-hand image of FIG. 9B)—in contrast to the tapering sides of the nanowires lying in the [100] and [010] directions. A benefit of this is that the resulting shadow junction will have straight, not tapered or angled SC, hence the width of the resulting shadow region (shadow width) is the same at the top and the bottom of the wire. That is to say, the vertical side-surfaces of the shadow wall cause the boundaries of the shadow region 404 to lie substantially perpendicular to the axis of the nanowire $A_{NW}$, as shown in the top-down view of phase P3 in FIG. 4 and the corresponding perspective view of FIG. 5, thereby forming an uncoated junction region having a substantially uniform width across the width of the nanowire 108. This is in contrast to the example of FIG. 10, in which the tapered profile of the trapezoidal shadow wall 408 cases tapering of the shadow region 404 from the base of the nanowire 108 to its apex 1002, and hence a junction of uncoated nanowire that exhibits corresponding tapering.

Figure 9D:
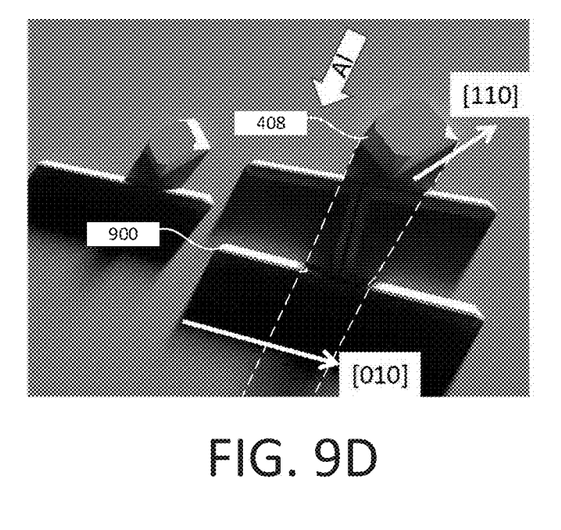
FIG. 9D shows a schematic perspective view of the arrangement of FIG. 9C.

This is illustrated schematically in FIG. 9D, which shows a perspective view of the arrangement of FIG. 9C in the deposition phase. A shadow region defined in the shadow wall 408 is denoted by a white dotted line superimposed on the perspective view.

As will be apparent from the above description, the relative crystallographic orientation of the crystalline semiconductor components (nanowires and smart walls) is determined by the mask pattern, and in particular the relative orientation of the exposed regions in the plane of the substrate. The 'absolute' crystallographic orientation of the semiconductor is determined by the crystal structure of the wafer 104 itself on which the semiconductor is selectively grown. The selective area growth is epitaxial, which means that each atom deposited in the SAG phase follows the same pattern as the existing atoms of the wafer 104. Hence, the crystallographic orientation of the semiconductor material will match the crystallographic orientation of the wafer 104. Hence, [100] and [010] nanowires can be grown perpendicular to [100] and [010] directions of the crystalline wafer 104 itself (i.e. as defined by the crustal structure of the wafer 104), whereas [110] and [1-10] nanowires can be grown perpendicular to the [110] and [1-10] directions of the crystalline wafer 104. This means that the desired vertical profiles of the nanowires 108 and shadow walls 408 can be achieved by appropriate orientation of the exposed region in which they are grown relative to the crystal structure of the wafer 104.

The resulting SM/SC nanostructure—that is, the nanowire 108 or network of such nanowires partially coated with superconductor 112—can be incorporated into a computer device, such as a quantum computer. The SM/SC nanostructure constitutes an operational computing component of the computer device, which is controllable (e.g. via one or more gates) to perform useful computational operations. In the case of a quantum computer, these could be quantum computations realized through the manipulation of qubits. In the context of SM/SC nanowires, qubits are generally embodied as an entangled quantum state of quasiparticles hosted in the SC/SM nanowires. By contrast, the shadow wall 408 may be excluded from the computer device altogether (where viable), or it may be incorporated into the computer device but as a dummy component which does not perform any useful computational operations. Provided the shadow wall 408 is separated from the SM/SC nanowires by a sufficient distance, the former will not significantly interfere with the operation of the latter.

Further aspects of the present disclosure, and example embodiments thereof, are set out below.

An noted, the above first aspect of the present disclosure provides a semiconductor fabrication method, the method comprising: in a masking phase, forming a mask layer on a substrate, wherein the mask layer leaves at least one wall region and at least one component region of the substrate exposed, the component region being adjacent the wall region in a plane of the substrate; in a selective area growth (SAG) phase, inducing selective area growth of crystalline semiconductor in the exposed regions of the substrate, wherein the wall and component regions have relative dimensions in the plane of the substrate, which cause a shadow wall component, formed of the crystalline semiconductor in the wall region, to grow to a greater height than a device component formed of the crystalline semiconductor in the component region; and in a deposition phase, selectively depositing a layer of deposition material on the device component using a deposition beam, which has a non-zero angle of incidence relative to a normal to the plane of the substrate and an orientation in the plane of the substrate such that the shadow wall component prevents deposition of the deposition material on a surface region of the device component adjacent the shadow wall component.

The surface region is a surface portion of the device component which lies in a shadow region defined by the shadow wall component.

In embodiments, the device component may be a nanowire which lies in the plane of the substrate.

The nanowire may be part of a network of nanowires formed of the crystalline semiconductor, the network of nanowires lying in the plane of the substrate.

The height of the shadow wall may exceed the height of the nanowire by an amount such that no deposition occurs in a junction region extending across the full width of the nanowire, the junction region comprising the surface region on which deposition is prevented by the shadow wall.

That is not to say that the shadow region necessarily extends across the full width of the nanowire (but neither is that possibility excluded), as there may be a region of the nanowire on which no deposition occurs in any event due to the angle of incidence and planar orientation of the beam.

For example, the nanowire may have at least two opposing facets, and the angle of incidence and the orientation of the beam are such that deposition occurs on a first of those facets only, wherein the shadow wall component is located nearest to the first facet such that the surface region extends from the base of the nanowire closest the shadow wall component across the full width of the first facet to at least a boundary of the second facet closest the shadow wall. The surface region on which deposition is prevented may lie within the shadow region defined by the shadow wall component, wherein the shadow region may extend across the full width of the first facet to at least said boundary of the second facet but does not extend across the full width of the nanowire, the junction region comprising the surface region within the shadow region and a further surface region of the second facet outside of the shadow region but on which no deposition occurs in any event (reference is made to FIG. 10 by way of example, and the accompanying description above).

The deposition material may be a superconductor material.

The SAG phase may continue (that is, SAG growth conditions may persist) after the device component has reached a maximum component height, wherein the shadow wall component continues to grow in height until the SAG phase is terminated whilst the height of the device component remains substantially fixed.

The maximum component height may be defined by the width of the component region and an orientation of the component region, in the plane of the substrate, relative to the crystal structure of the crystalline semiconductor.

The SAG phase may be terminated before the shadow wall has reached a maximum wall height, such that the shadow wall has a substantially flat top surface that lies substantially parallel to the plane of the substrate.

The maximum wall height may be defined by the width of the wall region and an orientation of the wall region relative to the crystal structure of the crystalline semiconductor.

The substrate may be arranged in the SAG phase such that the component region has an orientation relative to the crystal structure of the crystalline semiconductor, which causes the device component to be formed with a substantially triangular profile across its width.

The substrate may be arranged in the SAG phase such that the wall region has an orientation relative to the crystal structure of the crystalline semiconductor, which causes the wall component to be formed with two substantially vertical side surfaces.

The SAG phase may be epitaxial such that the crystal structure of the deposited crystalline semiconductor has an orientation which matches a crystal structure orientation of the substrate on which it is formed. In that case, the desired profiles can be achieved by appropriate orientation of the exposed regions relative to the crystal structure of the exposed substrate.

The device component may be an elongated component (such as a nanowire) which extends along an axis of the device component lying in the plane of the substrate, wherein the vertical side surfaces of the shadow wall may be located relative to the nanowire such that the surface region on which the shadow wall prevents deposition has boundaries lying substantially perpendicular to the axis of the device component.

The wall region may have a width greater than a width of the component region.

The wall and device regions may extend along respective axes lying perpendicular to their widths in the plane of the substrate.

The wall region and the device region may be non-contiguous.

In embodiments of the above-mentioned second aspect (or, indeed, in of any aspect of this disclosure), the computing component may embody at least one qubit, which is controllable to perform quantum computations.

The semiconductor shadow wall may have a greater height (extent in the direction perpendicular to the plane of the substrate) than the surface portion of the semiconductor nanostructure within the shadow region.

The semiconductor nanostructure may comprise a nanowire or network of nanowires lying in the plane of the substrate.

A third aspect of the present disclosure provides a method of fabricating a semiconductor nanodevice, the semiconductor nanodevice being partially coated with superconductor material for performing topological quantum computations, the method comprising: in a masking phase, forming a mask layer on a substrate, wherein the mask layer leaves at least one wall region and at least one device region of the substrate exposed, the wall region being adjacent the device region in a plane of the substrate; in a selective area growth (SAG) phase, inducing selective area growth of crystalline semiconductor in the exposed regions of the substrate; and in a deposition phase, selectively depositing a layer of the superconductor material on the semiconductor nanodevice using a deposition beam, which has a non-zero angle of incidence relative to a normal to the plane of the substrate and an orientation in the plane of the substrate such that a shadow wall component prevents deposition of the superconductor material on a surface portion of the semiconductor nanostructure within a shadow region defined by the shadow wall component, the shadow wall component and the semiconductor nanostructure both having been formed in, from the crystalline semiconductor material in the SAG phase, in the wall region and the at least one device region respectively, wherein the wall and device regions have relative dimensions in the plane of the substrate, which cause the extent of the shadow wall component in a direction perpendicular to the plane of the substrate to exceed that of the surface portion on which the shadow wall prevents deposition.

The disclosed methods, apparatus, and systems should not be construed as limiting in any way. The technologies from any example can be combined with the technologies described in any one or more of the other examples. In view of the many possible embodiments to which the principles of the disclosed technology may be applied, it should be recognized that the illustrated embodiments are examples of the disclosed technology and should not be taken as a limitation on the scope of the disclosed technology. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A semiconductor fabrication method, the method comprising:
    in a masking phase, forming a mask layer on a substrate, wherein the mask layer leaves at least one wall region and at least one component region of the substrate exposed, the component region being adjacent the wall region in a plane of the substrate;
    in a selective area growth (SAG) phase, inducing selective area growth of crystalline semiconductor in the exposed regions of the substrate, wherein the wall and component regions have relative dimensions in the plane of the substrate, which cause a shadow wall component, formed of the crystalline semiconductor in the wall region, to grow to a greater height than a device component formed of the crystalline semiconductor in the component region; and
    in a deposition phase, selectively depositing a layer of deposition material on the device component using a deposition beam, which has a non-zero angle of incidence relative to a normal to the plane of the substrate and an orientation in the plane of the substrate such that the shadow wall component prevents deposition of the deposition material on a surface region of the device component adjacent the shadow wall component.

2. The method of claim 1, wherein the device component is a nanowire which lies in the plane of the substrate.

3. The method of claim 2, wherein the nanowire is part of a network of nanowires formed of the crystalline semiconductor, the network of nanowires lying in the plane of the substrate.

4. The method of claim 2, wherein the height of the shadow wall exceeds the height of the nanowire by an amount such that no deposition occurs in a junction region extending across the full width of the nanowire, the junction region comprising the surface region on which deposition is prevented by the shadow wall.

5. The method of claim 4, wherein the nanowire has at least two opposing facets, and the angle of incidence and the orientation of the beam are such that deposition occurs on a first of those facets only, wherein the shadow wall component is located nearest to the first facet such that the surface region extends from the base of the nanowire closest the shadow wall component across the full width of the first facet to at least a boundary of the second facet closest the shadow wall.

6. The method of claim 4, wherein the surface region on which deposition is prevented lies within a shadow region defined by the shadow wall component, wherein the shadow region extends across the full width of the first facet to at least said boundary of the second facet but does not extend across the full width of the nanowire, the junction region comprising the surface region within the shadow region and a further surface region of the second facet outside of the shadow region but on which no deposition occurs in any event.

7. The method of claim 1, wherein the deposition material is a superconductor material.

8. The method of claim 1, wherein the SAG phase continues after the device component has reached a maximum component height, wherein the shadow wall component continues to grow in height until the SAG phase is terminated whilst the height of the device component remains substantially fixed.

9. The method of claim 8, wherein the maximum component height is defined by the width of the component region and an orientation of the component region, in the plane of the substrate, relative to the crystal structure of the crystalline semiconductor.

10. The method of claim 8, wherein the SAG phase is terminated before the shadow wall has reached a maximum wall height, such that the shadow wall has a substantially flat top surface that lies substantially parallel to the plane of the substrate.

11. The method of claim 10, wherein the maximum wall height is defined by the width of the wall region and an orientation of the wall region relative to the crystal structure of the crystalline semiconductor.

12. The method of claim 1, wherein the substrate is arranged in the SAG phase such that the component region has an orientation relative to the crystal structure of the crystalline semiconductor, which causes the device component to be formed with a substantially triangular profile across its width.

13. The method of claim 1, wherein the substrate is arranged in the SAG phase such that the wall region has an orientation relative to the crystal structure of the crystalline semiconductor, which causes the wall component to be formed with two substantially vertical side surfaces.

14. The method of claim 13, wherein the device component is an elongated component which extends along an axis of the device component lying in the plane of the substrate, wherein the vertical side surfaces of the shadow wall are located relative to the elongated device component such that the surface region on which the shadow wall prevents deposition has boundaries lying substantially perpendicular to the axis of the device component.

15. The method according to claim 1, wherein the wall region has a width greater than a width of the component region.

16. The method of claim 1, wherein the wall region and the device region are non-contiguous.

17. A method of selectively patterning a semiconductor nanostructure with deposition material, the method comprising:
  using a deposition beam to selectively deposit a layer of deposition material on the semiconductor nanostructure, the semiconductor nanostructure being located, on a surface of a substrate, adjacent a semiconductor shadow wall on the substrate's surface;
  wherein the semiconductor nanostructure and the adjacent semiconductor shadow wall are disconnected and separated by a non-zero distance in the plane of the substrate, and wherein the substrate's surface lies substantially parallel to a plane of the substrate, and the deposition beam has a non-zero angle of incidence relative to a normal to the plane of the substrate and an orientation in the plane of the substrate such that the shadow wall component prevents deposition on a surface portion of the semiconductor nanostructure within a shadow region defined by the semiconductor shadow wall.

18. The method of claim 17, the semiconductor structure and the layer of deposition material selectively deposited thereon are incorporated into a computer device, the semiconductor nanostructure and the layer of deposition material deposited thereon constituting a computing component of the computer device which is controllable to perform computational operations, wherein the semiconductor wall component is not incorporated in the computer device or is incorporated as a dummy component which does not perform any computational operations.

19. A method according to claim 18, wherein the computing component embodies a set of qubits, which is controllable to perform quantum computations.

20. A method of fabricating a semiconductor nanodevice, the semiconductor nanodevice being partially coated with superconductor material for performing topological quantum computations, the method comprising:
  in a masking phase, forming a mask layer on a substrate, wherein the mask layer leaves at least one wall region and at least one device region of the substrate exposed, the wall region being adjacent the device region in a plane of the substrate;
  in a selective area growth (SAG) phase, inducing selective area growth of crystalline semiconductor in the exposed regions of the substrate; and
  in a deposition phase, selectively depositing a layer of the superconductor material on the semiconductor nanodevice using a deposition beam, which has a non-zero angle of incidence relative to a normal to the plane of the substrate and an orientation in the plane of the substrate such that a shadow wall component prevents deposition of the superconductor material on a surface portion of the semiconductor nanostructure within a shadow region defined by the shadow wall component, the shadow wall component and the semiconductor nanostructure both having been formed in, from the crystalline semiconductor material in the SAG phase, in the wall region and the at least one device region respectively, wherein the wall and device regions have relative dimensions in the plane of the substrate, which cause the extent of the shadow wall component in a direction perpendicular to the plane of the substrate to exceed that of the surface portion on which the shadow wall prevents deposition.

* * * * *